(12) United States Patent
Cheng et al.

(10) Patent No.: US 11,430,651 B2
(45) Date of Patent: Aug. 30, 2022

(54) NANOSHEET TRANSISTORS WITH SHARP JUNCTIONS

(71) Applicant: International Business Machines Corporation, Armonk, NY (US)

(72) Inventors: Kangguo Cheng, Schenectady, NY (US); Lawrence A. Clevenger, Rhinebeck, NY (US); Balasubramanian S. Pranatharthi Haran, Watervliet, NY (US); John Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 83 days.

(21) Appl. No.: 15/958,050

(22) Filed: Apr. 20, 2018

(65) Prior Publication Data

US 2018/0240871 A1 Aug. 23, 2018

Related U.S. Application Data

(62) Division of application No. 15/332,440, filed on Oct. 24, 2016, now Pat. No. 10,600,638.

(51) Int. Cl.
*H01L 29/06* (2006.01)
*H01L 29/66* (2006.01)
*H01L 21/02* (2006.01)
*H01L 29/165* (2006.01)
*H01L 29/786* (2006.01)
(Continued)

(52) U.S. Cl.
CPC .... *H01L 21/0214* (2013.01); *H01L 21/02164* (2013.01); *H01L 21/02167* (2013.01); *H01L 21/02236* (2013.01); *H01L 29/0665* (2013.01); *H01L 29/165* (2013.01); *H01L 29/42392* (2013.01); *H01L 29/6656* (2013.01); *H01L 29/66545* (2013.01); *H01L 29/66636* (2013.01); *H01L 29/66772* (2013.01); *H01L 29/778* (2013.01); *H01L 29/78618* (2013.01);
(Continued)

(58) Field of Classification Search
None
See application file for complete search history.

(56) References Cited

U.S. PATENT DOCUMENTS 7,247,535 B2 7/2007 Jain
7,692,213 B2 4/2010 Teo et al.
(Continued)

OTHER PUBLICATIONS

Cheng et al., "Nanosheet Transistors With Sharp Junctions," U.S. Appl. No. 15/332,440, filed Oct. 24, 2016.
(Continued)

*Primary Examiner* — Daniel Whalen
(74) *Attorney, Agent, or Firm* — Cantor Colburn LLP; Joseph Petrokaitis

(57) ABSTRACT

A method of forming a semiconductor device and resulting structures having nanosheet transistors with sharp junctions by forming a nanosheet stack over a substrate, the nanosheet stack having a plurality of nanosheets alternating with a plurality of sacrificial layers, such that a topmost and a bottommost layer of the nanosheet stack is a sacrificial layer; forming an oxide recess on a first and a second end of each sacrificial layer; and forming a doped extension region on a first and a second end of each nanosheet.

6 Claims, 11 Drawing Sheets

(51) Int. Cl.
    *H01L 29/423*     (2006.01)
    *H01L 29/778*     (2006.01)

(52) U.S. Cl.
    CPC .. *H01L 29/78621* (2013.01); *H01L 29/78654* (2013.01); *H01L 29/78696* (2013.01)

(56) References Cited

U.S. PATENT DOCUMENTS

| | | | |
|---|---|---|---|
| 9,040,391 | B2 | 5/2015 | Damlencourt et al. |
| 9,362,355 | B1* | 6/2016 | Cheng ............... H01L 29/66742 |
| 9,620,590 | B1* | 4/2017 | Bergendahl ......... H01L 29/0673 |
| 9,653,289 | B1 | 5/2017 | Balakrishnan et al. |
| 2012/0161203 | A1 | 6/2012 | Flachowsky et al. |
| 2016/0099338 | A1 | 4/2016 | Chang et al. |
| 2016/0126310 | A1* | 5/2016 | Rodder ............. H01L 29/41758 257/9 |
| 2016/0141360 | A1 | 5/2016 | Cheng et al. |
| 2017/0110554 | A1* | 4/2017 | Tak .................... H01L 29/4991 |
| 2017/0222006 | A1* | 8/2017 | Suh .................... H01L 23/5283 |
| 2017/0338328 | A1* | 11/2017 | Wang ............... H01L 21/02236 |

OTHER PUBLICATIONS

IBM "List of IBM Patents or Patent Applications Treated as Related; (Appendix P)", Filed Apr. 23, 2018, 2 pages.

\* cited by examiner

NANOSHEET TRANSISTORS WITH SHARP JUNCTIONS

DOMESTIC PRIORITY

This application is a divisional of U.S. application Ser. No. 15/332,440, entitled "NANOSHEET TRANSISTORS WITH SHARP JUNCTIONS", filed Oct. 24, 2016, which is incorporated herein by reference in its entirety.

BACKGROUND

The present invention relates in general to semiconductor device fabrication methods and resulting structures. More specifically, the present invention relates to fabrication methods and resulting structures for a semiconductor device having nanosheet transistors with sharp junctions.

In contemporary semiconductor device fabrication processes a large number of semiconductor devices, such as field effect transistors (FETs), are fabricated on a single wafer. FETs employ semiconductor fins to introduce on-wafer topography. With growing challenges in maintaining physical gate-length scaling and device performance tradeoff, extending the technology roadmap with lateral devices to and beyond the 10 nm technology node is becoming increasingly difficult. Non-planar device architectures, such as vertical fin and nanosheet FET devices, result in increased device density over lateral devices.

SUMMARY

According to one or more embodiments of the present invention, a method of fabricating a semiconductor device having nanosheet transistors with sharp junctions is provided. The method can include forming a nanosheet stack over a substrate, the nanosheet stack having a plurality of nanosheets alternating with a plurality of sacrificial layers, such that a topmost and a bottommost layer of the nanosheet stack is a sacrificial layer; forming an oxide recess on a first and a second end of each sacrificial layer; and forming a doped extension region on a first and a second end of each nanosheet.

According to one or more embodiments of the present invention, a structure having nanosheet transistors with sharp junctions is provided. The structure can include a nanosheet stack over a substrate, the nanosheet stack having a plurality of nanosheets alternating with a plurality of sacrificial layers, such that a topmost and a bottommost layer of the nanosheet stack is a sacrificial layer; an oxide recess on a first and a second end of each sacrificial layer; and a doped extension region on a first and a second end of each nanosheet.

According to one or more embodiments of the present invention, a method of fabricating a semiconductor device having nanosheet transistors with sharp junctions is provided. The method can include forming a nanosheet stack over a substrate, the nanosheet stack having a plurality of silicon nanosheets alternating with a plurality of silicon germanium (SiGe) sacrificial layers, such that a topmost and a bottommost layer of the nanosheet stack is a sacrificial layer; oxidizing a first and a second end of each SiGe sacrificial layer to form a silicon oxide (SiO) recess, displacing germanium in the first and second end of each sacrificial layer to a first and a second end of each silicon nanosheet; and exposing the nanosheet stack to a dopant, the dopant preferentially doping a SiGe extension region on the first and second end of each silicon nanosheet, the SiGe extension region defined by the displaced germanium in the first and second end of each silicon nanosheet.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
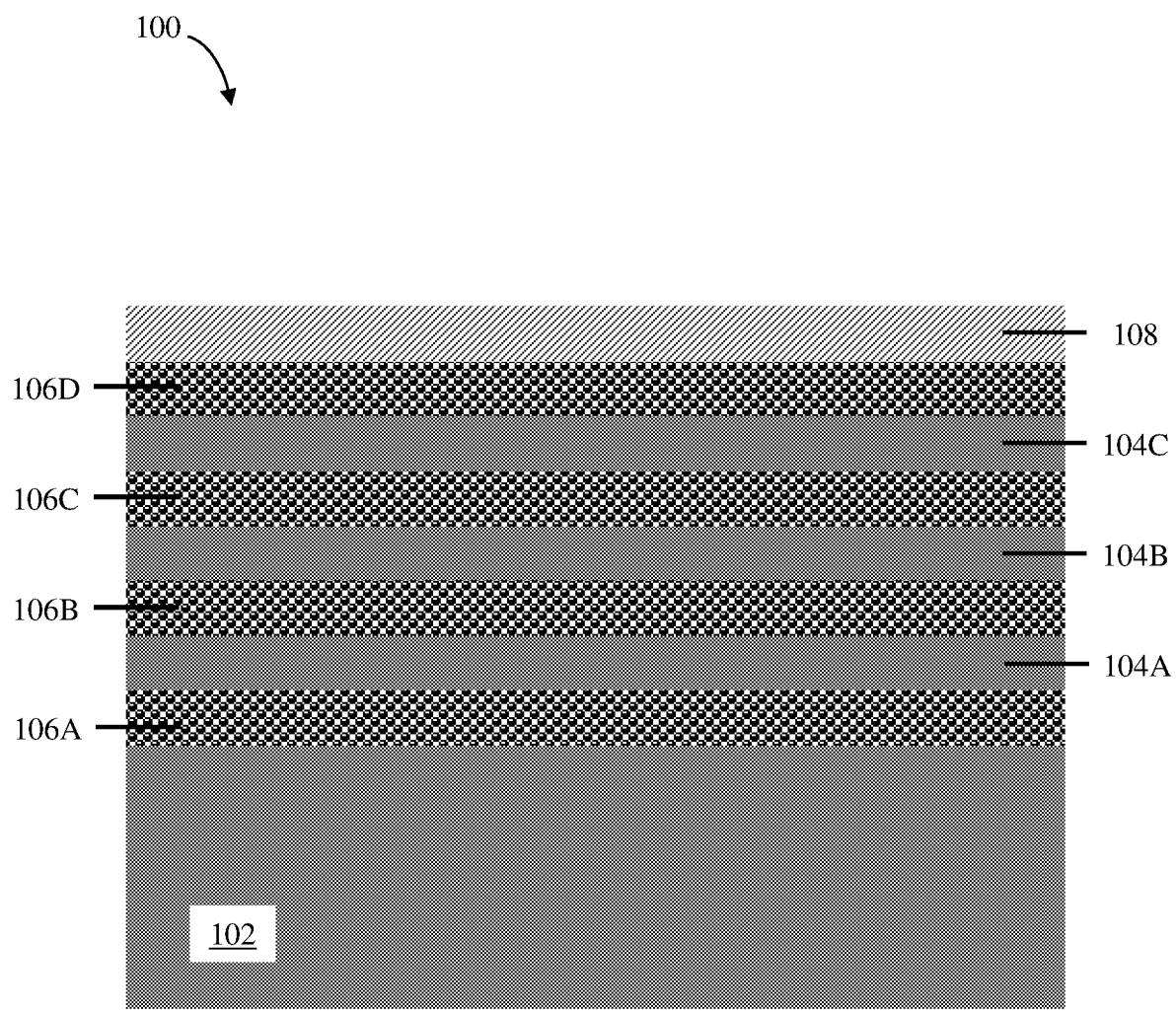
FIG. 1 depicts a cross-sectional view of a structure having a nanosheet stack formed on a substrate during an intermediate operation of a method of fabricating a semiconductor device according to one or more embodiments of the present invention.

Various embodiments of the present invention are described herein with reference to the related drawings.

Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having an etch-resistant ILD that maintains height during a top epitaxy clean according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, non-planar device architectures, such as vertical fin and nanosheet FET devices, result in increased device density over lateral devices. However, there are challenges in providing non-planar FETs having equal or superior performance characteristics to lateral devices. For example, some non-planar devices require careful management of transistor drive currents while reducing short-channel effects, parasitic capacitance and off-state leakage. Nanosheet-based devices advantageously enable improved control of short channel effects. For example, in nanosheet-based transistors the gate stack wraps around the full perimeter of the nanosheet, enabling fuller depletion in the channel region, and reducing short-channel effects due to steeper subthreshold swing (SS) and smaller drain induced barrier lowering (DIBL). Wrap-around gate structures and source/drain contacts used in nanosheet devices also enable greater management of leakage and capacitance in the active regions, even as drive currents increase.

The fabrication of nanosheet FET semiconductor structures requires forming an inner spacer between adjacent nanosheets. The inner spacer can be any insulating material, such as, for example, a low-k dielectric material. The inner spacer acts to inhibit the parasitic overlap capacitance between the gate and the source/drain epitaxy regions. Parasitic capacitance, or conductor-to-conductor capacitance, between two conductors is a function of the length and thickness of the conductors as well as the distance separating the conductors. Parasitic capacitance contributes to undesired device effects such as RC delay, power dissipation, and cross-talk. Unfortunately, parasitic capacitance continues to increase as device dimensions and component spacing shrinks to meet increasing demands for smaller electronic devices.

While the use of inner spacers serves to inhibit the parasitic overlap capacitance between the gate and the source/drain epitaxy regions, the use of inner spacers introduces manufacturing difficulties. In nanosheet device fabrication it is difficult to provide a good process control scheme to ensure a sharp nanosheet junction, resulting in degraded device performance. A nanosheet junction is defined as the dopant concentration gradient region between p-doped and n-doped regions, such as, for example, the gradient region between a nanosheet (channel region) and an epitaxy (source/drain region). These junctions are critical to device performance, and ideally, the junction region width is as small as possible. Thus, a method is desired for forming nanosheet transistors with sharp junctions.

Turning now to an overview of aspects of the present invention, one or more embodiments provide methods of fabricating a semiconductor device having nanosheet transistors with sharp junctions. The described methods employ a selective oxidation operation to form an extension region between each nanosheet and the source/drain epitaxy. The extension region is a preferred dopant region that ensures a sharp junction. Methods for fabricating a semiconductor device having nanosheet transistors with sharp junctions and the resulting structures therefrom in accordance with embodiments of the present invention are described in detail below by referring to the accompanying drawings in FIGS. 1-11.

FIG. 1 illustrates a cross-sectional view of a structure 100 having a nanosheet stack formed on a substrate 102 during an intermediate operation of a method of fabricating a semiconductor device according to one or more embodiments. In some embodiments, the nanosheet stack includes three vertically-stacked nanosheets 104A, 104B, and 104C alternating with three sacrificial layers 106A, 106B, 106C, and 106D. For ease of discussion reference is made to operations performed on and to a nanosheet stack having three nanosheets (104A, 104B, and 104C). It is understood that the nanosheet stack can include any number of nanosheets alternating with a corresponding number of sacrificial layers such that a topmost and a bottommost layer of the nanosheet stack is a sacrificial layer.

In some embodiments, the nanosheet stack includes a first sacrificial layer on a single nanosheet, the nanosheet separated from the substrate 102 by a second sacrificial layer. In still other embodiments, the nanosheet stack includes five nanosheets alternating with six sacrificial layers. The nanosheets can be any suitable material such as, for example, monocrystalline silicon. The substrate 102 can be any suitable substrate material, such as, for example, monocrystalline Si, SiC, or semiconductor-on-insulator (SOI). In some embodiments, the sacrificial layers can be silicon germanium (SiGe). In still other embodiments, the germanium concentration (atomic concentration) of the sacrificial SiGe layers can be about 20 percent to about 75 percent. In some embodiments, the nanosheets and sacrificial layers can each have a thickness of about 3 nm to about 12 nm. In yet other embodiments, the nanosheets and sacrificial layers can each have a thickness of about 8 nm.

In some embodiments, a sacrificial liner 108 can be formed on the nanosheet stack. The sacrificial liner 108 can be any suitable material, such as, for example, a SiO or other dielectric material.

Figure 2:
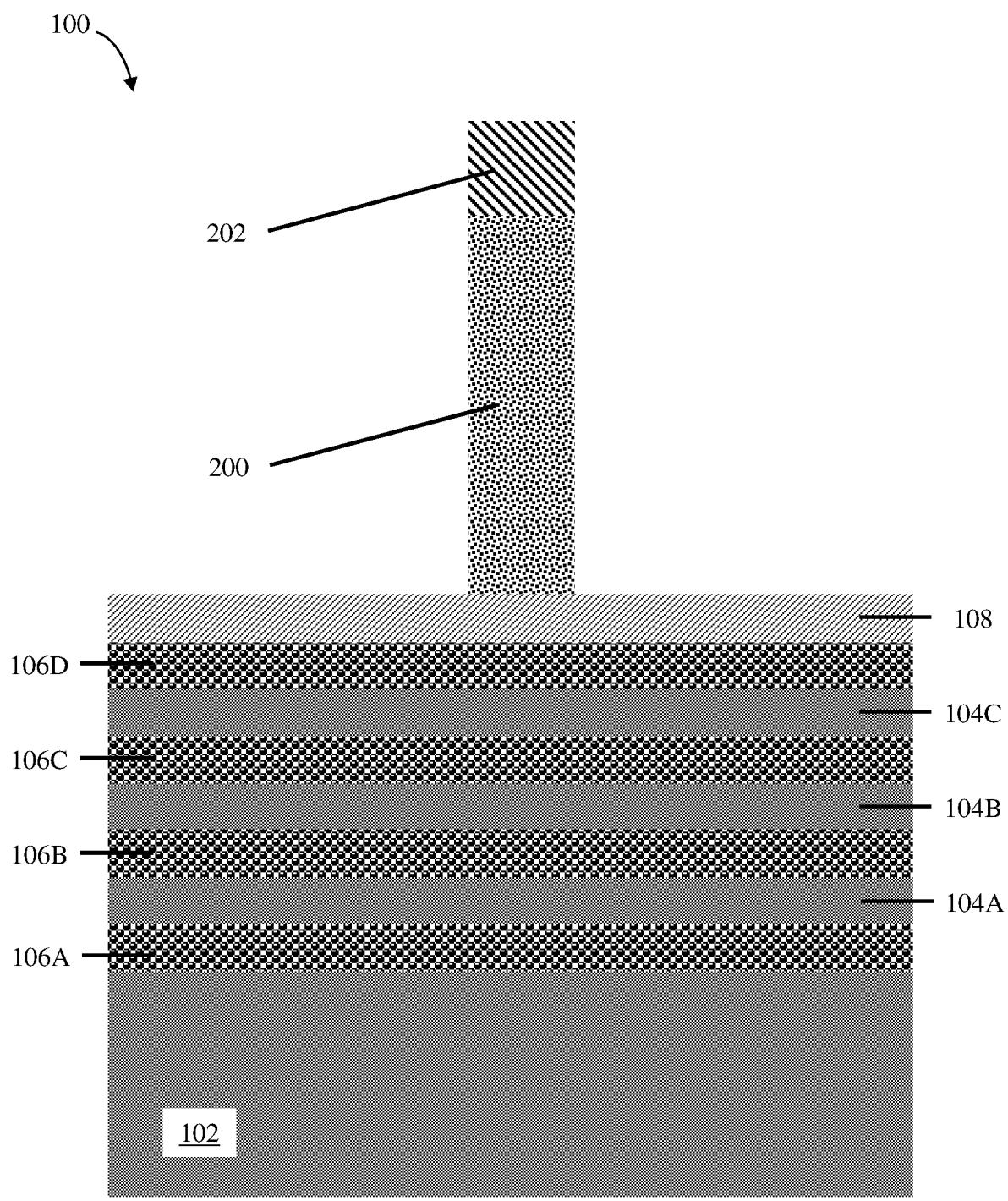
FIG. 2 depicts a cross-sectional view of the structure after forming a sacrificial gate having a hard mask on a sacrificial liner according to one or more embodiments of the present invention.

FIG. 2 illustrates a cross-sectional view of the structure 100 after forming a sacrificial gate 200 having a hard mask 202 on the sacrificial liner 108. The hard mask 202 is formed on a top surface of the sacrificial gate 200. The hard mask 202 can be any suitable material, such as, for example, a silicon nitride (SiN). Any known composition and manner of forming the sacrificial gate 200 can be utilized. In some embodiments, the sacrificial gate 200 is formed by patterning the hard mask 202 and using a wet or dry etching operation to selectively remove portions of the sacrificial gate material, which are not covered by the pattered hard mask 202. In some embodiments, hard mask 202 is patterned by a sidewall image transfer (SIT) operation. In still other embodiments, hard mask 202 is patterned by a photomask operation. In some embodiments, the etching operating is a RIE etch selective to the sacrificial liner 108. In still other embodiments, the sacrificial gate 200 is formed by a SIT operation having sacrificial mandrels.

Figure 3:
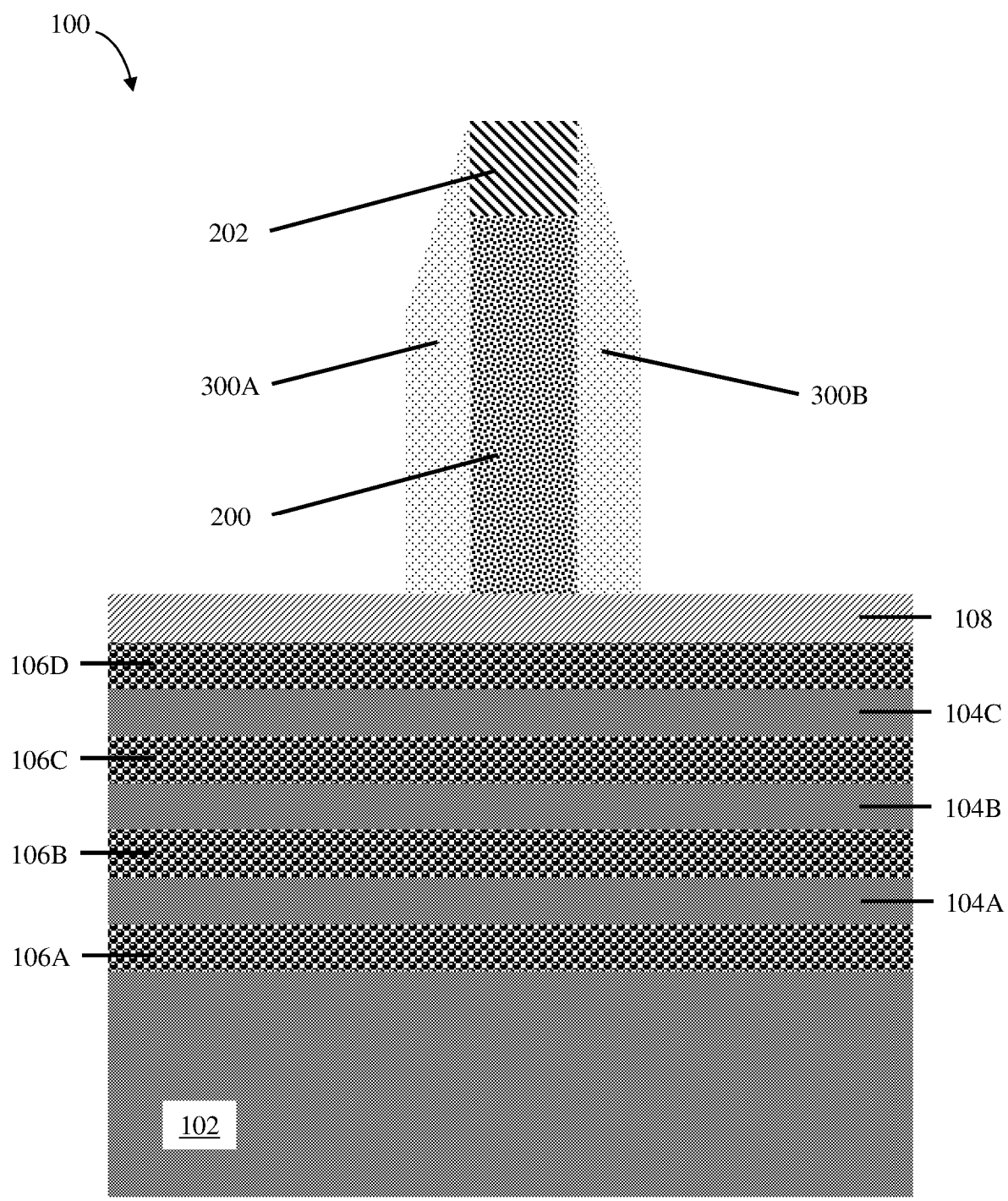
FIG. 3 depicts a cross-sectional view of the structure after forming a first outer spacer on a first sidewall of the sacrificial gate and a second outer spacer on a second sidewall of the sacrificial gate according to one or more embodiments of the present invention.

FIG. 3 illustrates a cross-sectional view of the structure 100 after forming a first outer spacer 300A on a first sidewall of the sacrificial gate 200 and a second outer spacer 300B on a second sidewall of the sacrificial gate 200. The outer spacers 300A and 300B can be any suitable material, such as, for example, a silicon oxide carbonitride (SiOCN) or a silicoboron carbonitride (SiBCN). Any known composition and manner of forming the outer spacers 300A and 300B can be utilized. In some embodiments, the outer spacers 300A and 300B are conformally deposited using CVD, plasma-enhanced chemical vapor deposition (PECVD), ALD, PVD, chemical solution deposition, or other like processes. In some embodiments, portions of the conformally deposited outer spacer are removed to expose a top surface of the hard mask 202 and a top surface of the sacrificial liner 108, the remaining portions of the outer spacer on the sidewalls of the sacrificial gate 200 defining the first outer spacer 300A and the second outer spacer 300B. Any known manner of removing portions of the conformally deposited outer spacer can be utilized. In some embodiments, the portions are removed using a directional etch selective to the hard mask 202 and the sacrificial liner 108. In some embodiments, an over etch occurs such that a portion of the outer spacer is etched back from a sidewall of the hard mask 202. In other embodiments, the directional etch is a reactive ion etch.

Figure 4:
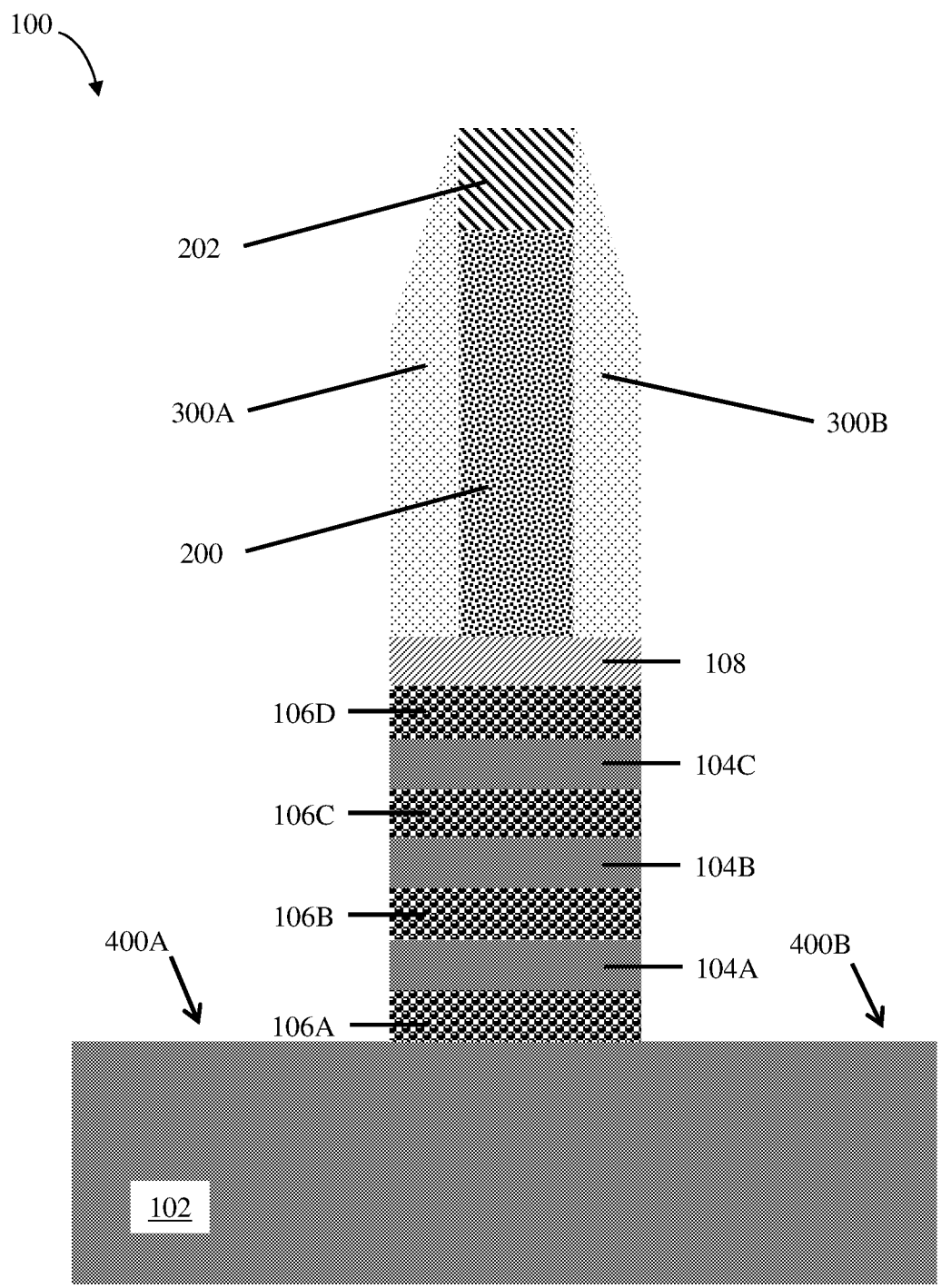
FIG. 4 depicts a cross-sectional view of the structure after removing a portion of the nanosheet stack to expose first and second ends of the nanosheet stack and first and second portions and of the substrate according to one or more embodiments of the present invention.

FIG. 4 illustrates a cross-sectional view of the structure 100 after removing a portion of the nanosheet stack to expose first and second ends of the nanosheet stack and first and second portions 400A and 400B of the substrate 102. The first and second portions 400A and 400B of the substrate 102 are on opposite sides of the nanosheet stack corresponding to the first and second ends of the nanosheet stack. Any known manner of removing portions of the nanosheet stack can be utilized. In some embodiments, the hard mask 202, the outer spacer 300A, and the outer spacer 300B are used as a mask to remove portions of the nanosheet stack not covered by the sacrificial gate or the outer spacers. In some embodiments, the portions are removed using a RIE operation. In some embodiments, the substrate 102 is a SOI having a buried oxide layer that serves as an etch stop during the RIE operation.

Figure 5:
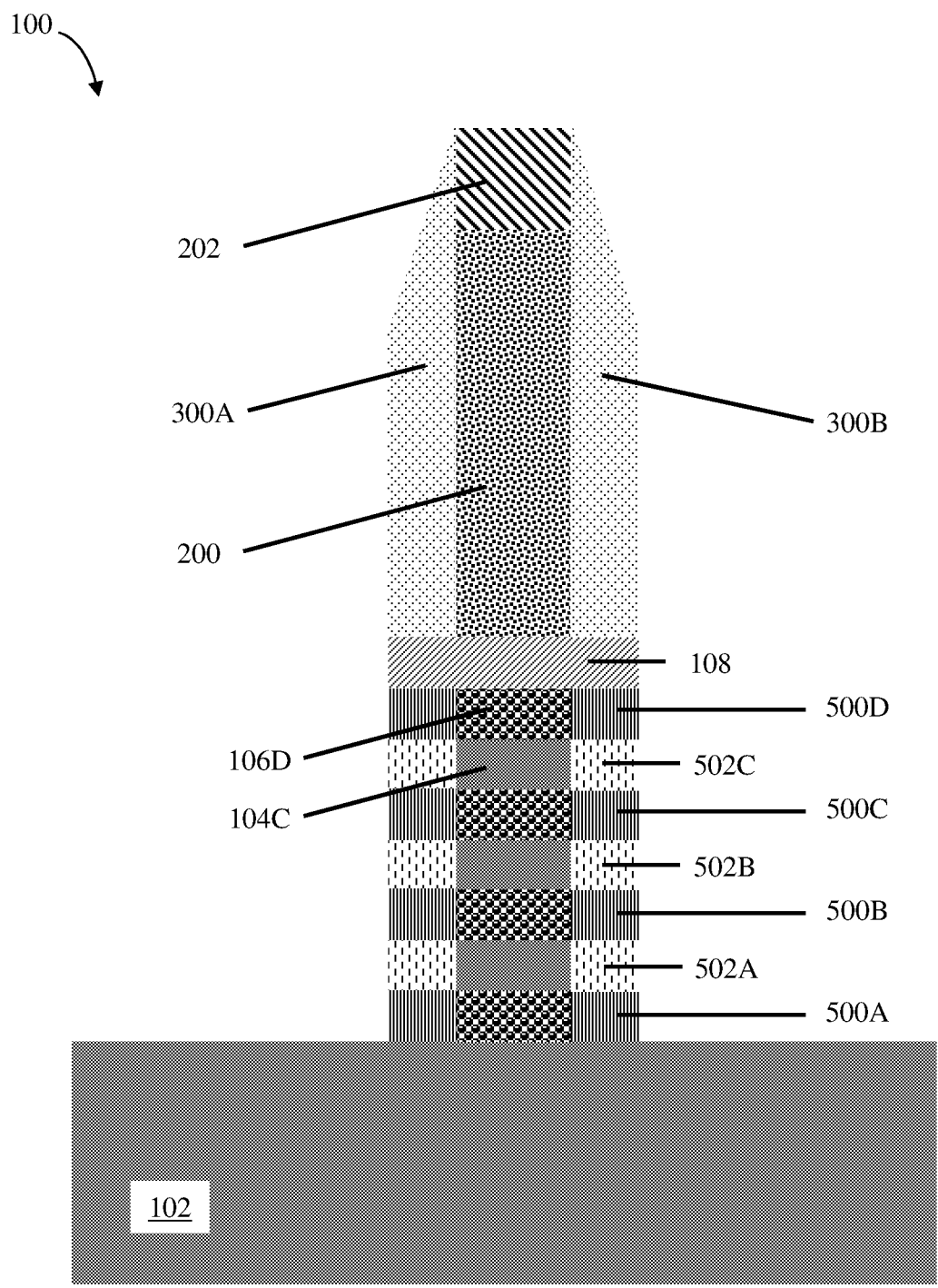
FIG. 5 depicts a cross-sectional view of the structure after forming oxide recess regions on the exposed ends of each sacrificial layer according to one or more embodiments of the present invention.

FIG. 5 illustrates a cross-sectional view of the structure 100 after forming oxide recess regions on the exposed ends of each sacrificial layer. For the sake of clarity, only oxide recess regions 500A, 500B, 500C, and 500D on one side of the nanosheet stack are illustrated. Similarly, only a single nanosheet and sacrificial layer (104C and 106D, respectively) are illustrated. It is understood that oxide recess regions form on both sides of each sacrificial layer. In some embodiments, the oxide recess regions are formed by exposing the nanosheet stack to an oxidant. The oxidant preferentially diffuses into exposed ends of each sacrificial layer, displacing a first material in the ends of each sacrificial layer to first and second ends of each nanosheet. In some embodiments, each nanosheet is silicon, each sacrificial layer is SiGe, and the oxidant is oxygen gas.

When simultaneously exposed to oxygen, SiGe is preferentially oxidized at an oxidation rate that is about 10 times greater than that of silicon. Furthermore, the germanium in SiGe does not react with the oxygen during an oxidation operation. Consequently, exposing the ends of the nanosheet to oxygen under a suitable oxidation temperature simultaneously serves two purposes. First, the exposed ends of each SiGe sacrificial layer are preferentially oxidized to form silicon oxide (SiO) recess regions (e.g., regions 500A, 500B, 500C, and 500D). Second, the germanium in the oxide recess regions is displaced, or condensed, into adjacent regions. Accordingly, oxidizing the exposed ends of each SiGe sacrificial layer forces the germanium in each oxide recess region to diffuse into the adjacent nanosheets, forming SiGe extension regions at the exposed ends of each nanosheet. For the sake of clarity, only extension regions 502A, 502B, and 502C on one side of the nanosheet stack are illustrated. It is understood that extension regions form on both sides of each nanosheet. In some embodiments, the oxidation process is performed at a temperature ranging from 400 degrees Celsius to 1000 degrees Celsius. The oxidation time ranges from 10 seconds to 1 hour. In some embodiments, the oxidation ambient includes oxygen. In some embodiments, the oxidation ambient includes water vapor.

Figure 6:
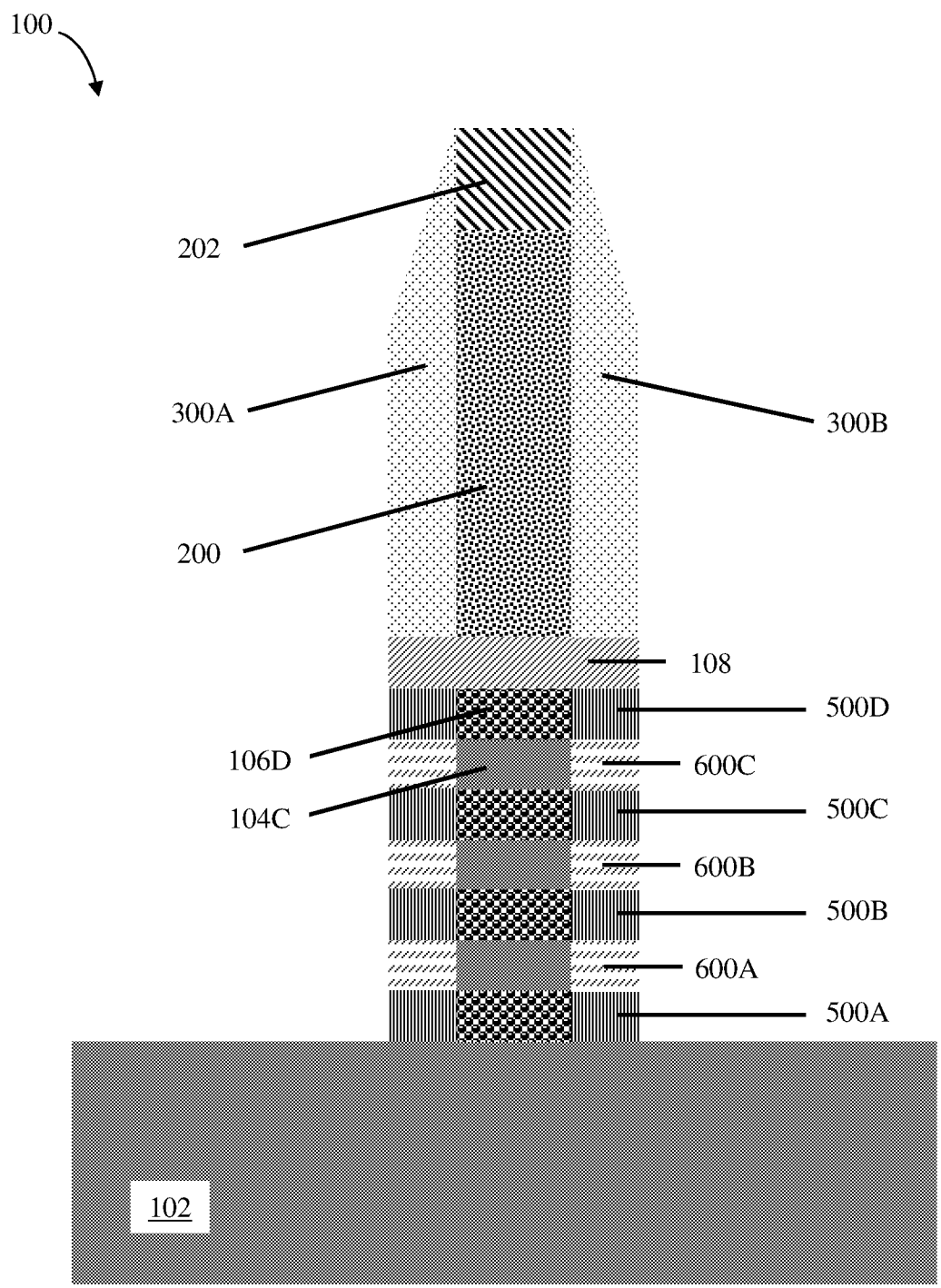
FIG. 6 depicts a cross-sectional view of the structure after exposing the nanosheet stack to a dopant to form doped extension regions according to one or more embodiments of the present invention.

FIG. 6 illustrates a cross-sectional view of the structure 100 after exposing the nanosheet stack to a dopant to form doped extension regions. In some embodiments, a precleaning step containing hydrofluoric acid is used to remove any oxide (which is much thinner than the oxide recess 500) at the ends of the nanosheets before the doping process. For the sake of clarity, only doped extension regions 600A, 600B, and 600C on one side of the nanosheet stack are illustrated. It is understood that doped extension regions are formed on both sides of each nanosheet.

When SiGe, silicon, and SiO are simultaneously exposed to a dopant, SiGe is preferentially doped at a faster rate than that of silicon. SiO is not appreciably doped, with a doping rate close to zero. Consequently, exposing the ends of the nanosheet (e.g., the oxide recess regions and the extension regions) to a dopant preferentially dopes the SiGe extension regions on each nanosheet, forming a sharp dopant concentration interface between the extension regions and the oxide recess regions, and between the extension regions and the silicon nanosheets. Leveraging the relative doping rates of SiGe, silicon, and SiO allow for a greater control of the extension region dimensions. In some embodiments, the doped extension region extends into each end of each nanosheet about 3 nm to about 12 nm. In other embodiments, the doped extension region extends into each end of each nanosheet about 5 nm to about 8 nm.

Figure 7:
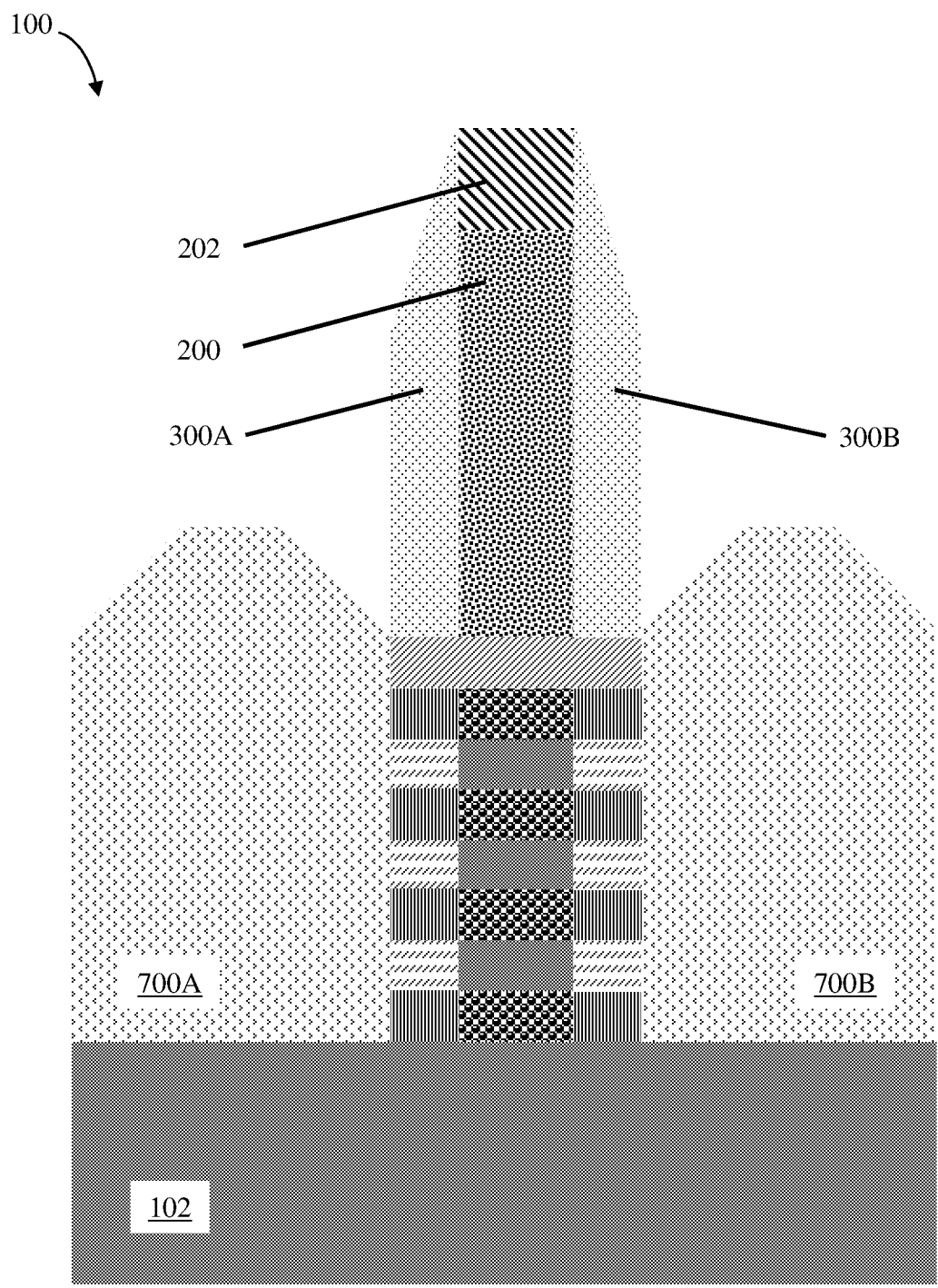
FIG. 7 depicts a cross-sectional view of the structure after forming a first epitaxy region on the first portion of the substrate and a second epitaxy region on the second portion of the substrate according to one or more embodiments of the present invention.

FIG. 7 illustrates a cross-sectional view of the structure 100 after forming a first epitaxy region 700A on the first portion 400A (depicted in FIG. 4) of the substrate 102 and a second epitaxy region 700B on the second portion 400B (depicted in FIG. 4) of the substrate 102. The first and second epitaxy regions 700A and 700B can be source or drain regions formed in the substrate 102 by a variety of methods, such as, for example, diffusion and/or ion implantation. The first and second epitaxy regions 700A and 700B are complementary, such that one of the epitaxy regions 700A and 700B is a source while the other is a drain.

The epitaxy regions 700A and 700B can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. Epitaxial materials can be grown from gaseous or liquid precursors. Epitaxial materials can be grown using vapor-phase epitaxy (VPE), MBE, liquid-phase epitaxy (LPE), or other suitable process. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $2\times10^{21}$ $cm^{-3}$, or preferably between $1\times10^{20}$ $cm^{-3}$ to $1\times10^{21}$ $cm^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the epitaxy regions 700A and 700B include silicon. In some embodiments, the epitaxy regions 700A and 700B include carbon doped silicon (Si:C). This Si:C layer can be grown in the same chamber used for other epitaxy steps or in a dedicated Si:C epitaxy chamber. The Si:C can include carbon in the range of 0.2 to 3.0%.

Figure 8:
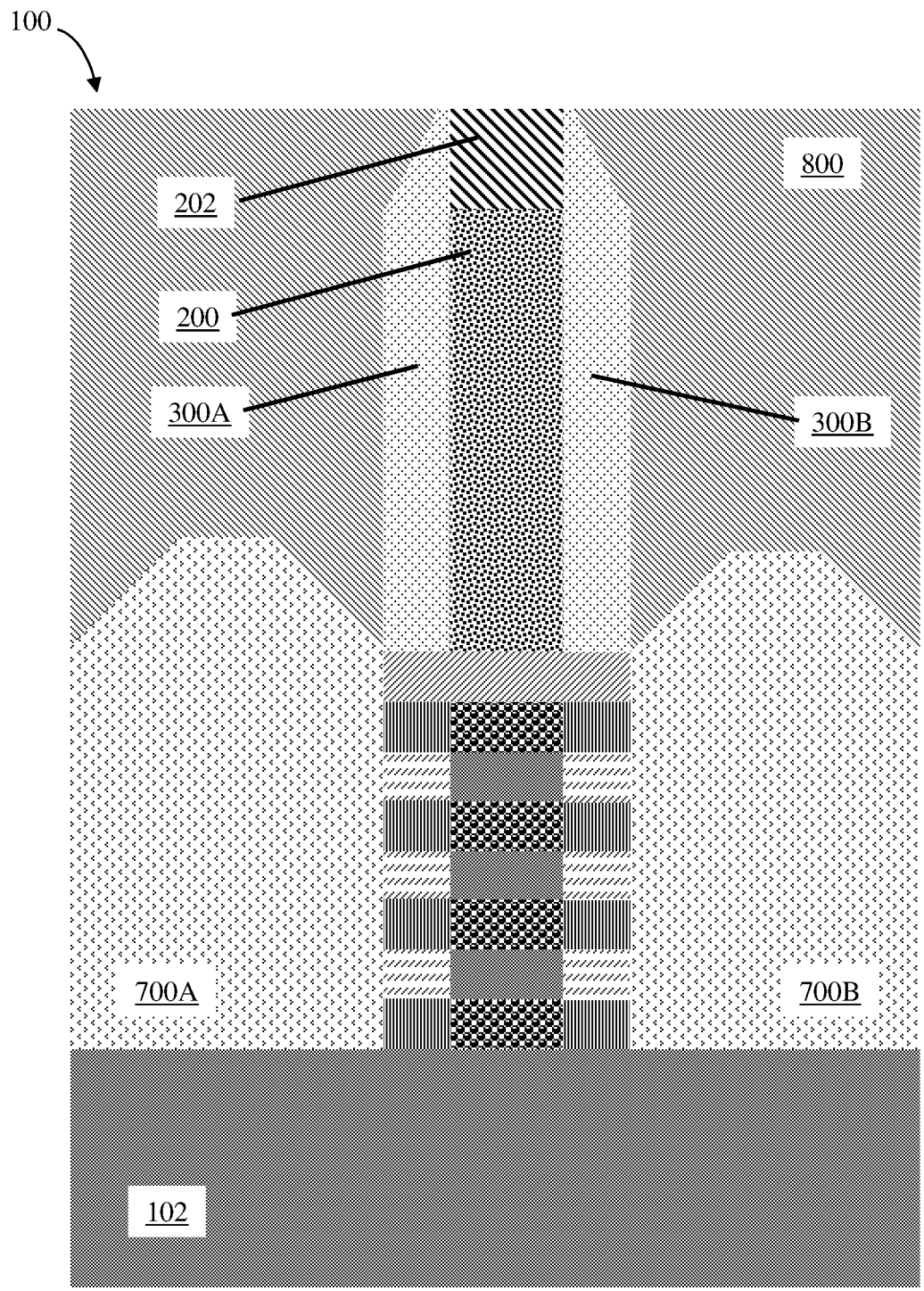
FIG. 8 depicts a cross-sectional view of the structure after forming an interlayer dielectric (ILD) over the first epitaxy region, the second epitaxy region, the first and second outer spacer layers, and the hard mask according to one or more embodiments of the present invention.

FIG. 8 illustrates a cross-sectional view of the structure 100 after forming an ILD 800 over the first epitaxy region 700A, the second epitaxy region 700B, the first and second outer spacer layers 300A and 300B, and the hard mask 202. The ILD 800 can be any suitable material, such as, for example, porous silicates, carbon doped oxides, silicon dioxides, silicon nitrides, silicon oxynitrides, or other dielectric materials. Any known manner of forming the ILD 800 can be utilized. The ILD 800 can be formed using, for example, CVD, plasma enhanced chemical vapor deposition, atomic layer deposition, flowable CVD, spin-on dielectrics, or physical vapor deposition. In some embodiments, the ILD 800 is planarized to a top surface of the hard mask 202, using, for example, a CMP operation.

Figure 9:
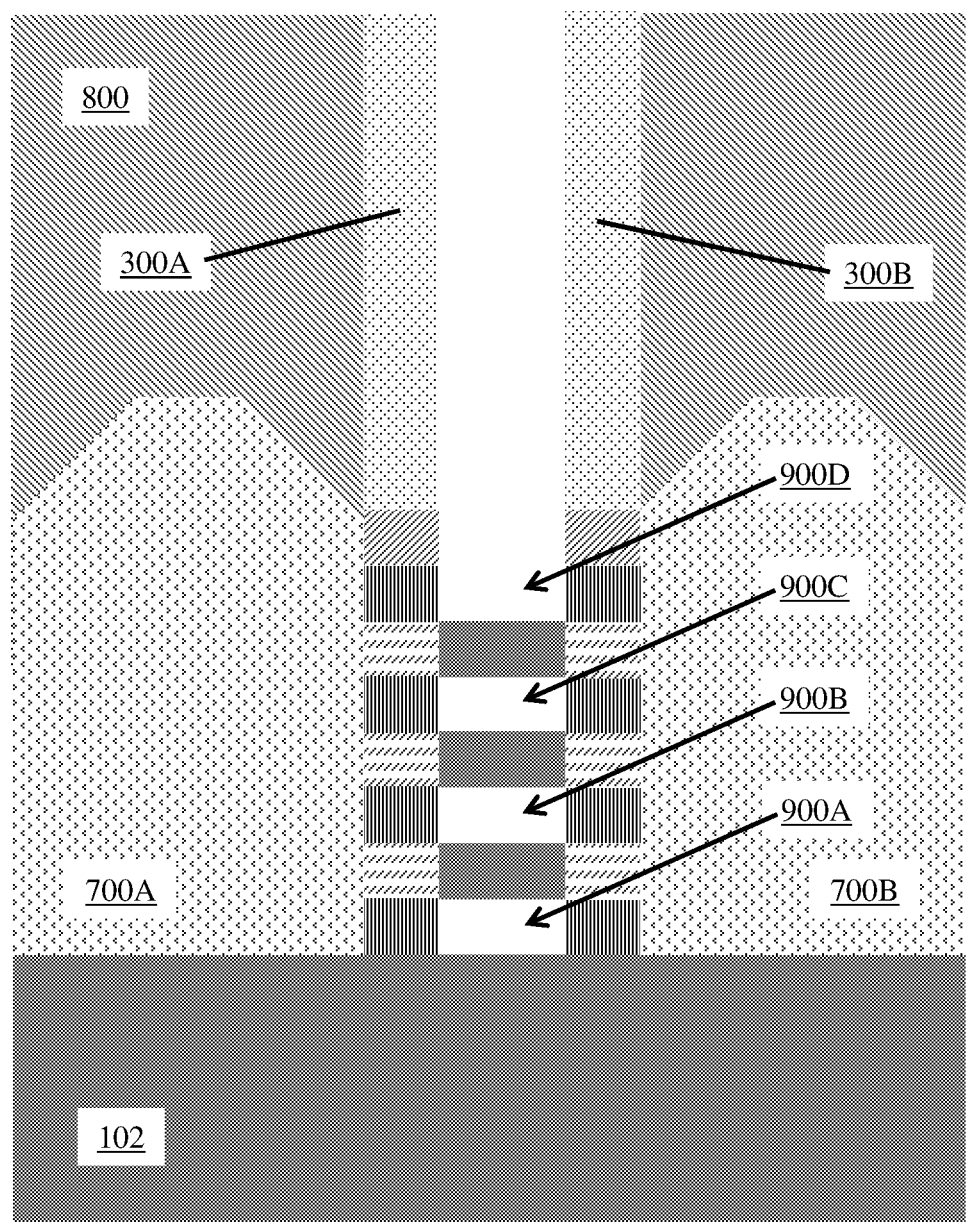
FIG. 9 depicts a cross-sectional view of the structure after opening the hard mask and removing the sacrificial gate and the sacrificial layers to form gaps between each nanosheet according to one or more embodiments of the present invention.

FIG. 9 illustrates a cross-sectional view of the structure 100 after opening the hard mask 202 and removing the sacrificial gate 200 and the sacrificial layers 106A, 106B, 106C, and 106D to form gaps 900A, 900B, 900C, and 900D between each nanosheet. Any known manner of removing the sacrificial gate 200 and the sacrificial layers 106A, 106B, 106C, and 106D can be utilized. In some embodiments, sacrificial materials are etched selective to the nanosheet and the outer spacer materials. In some embodiments, the sacrificial materials comprise SiGe and the nanosheets comprise silicon. The sacrificial SiGe can be removed selective to silicon by using gas phase hydrochloride.

Figure 10:
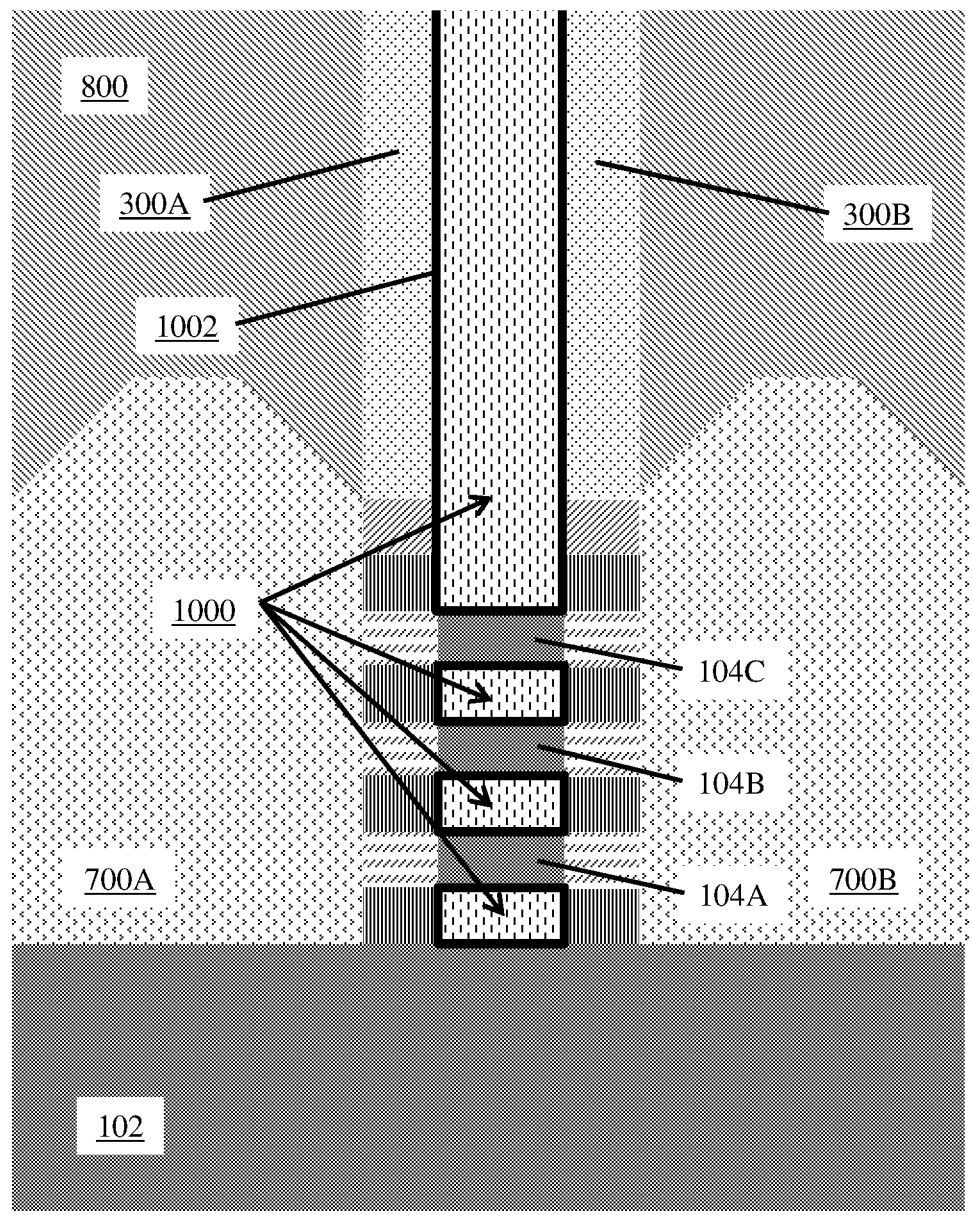
FIG. 10 depicts a cross-sectional view of the structure after replacing the sacrificial materials removed from the gaps with a metal gate according to one or more embodiments of the present invention.

FIG. 10 illustrates a cross-sectional view of the structure 100 after replacing the sacrificial materials removed from the gaps 900A, 900B, 900C, and 900D with a metal gate 1000. The metal gate 1000 wraps around a surface each nanosheet 104A, 104B, and 104C. Any known manner of forming the metal gate 1000 can be utilized. In some embodiments, the metal gate 1000 is lined with a high-k dielectric 1002. In still other embodiments, a metallization operation deposits a first contact contacting the first epitaxy region 700A and a second contact contacting the second epitaxy region 700B (not depicted). Any known manner of depositing the first and second contacts can be utilized. In some embodiments, the ILD 800 is patterned with open trenches and the first and second contacts are deposited into the trenches.

Figure 11:
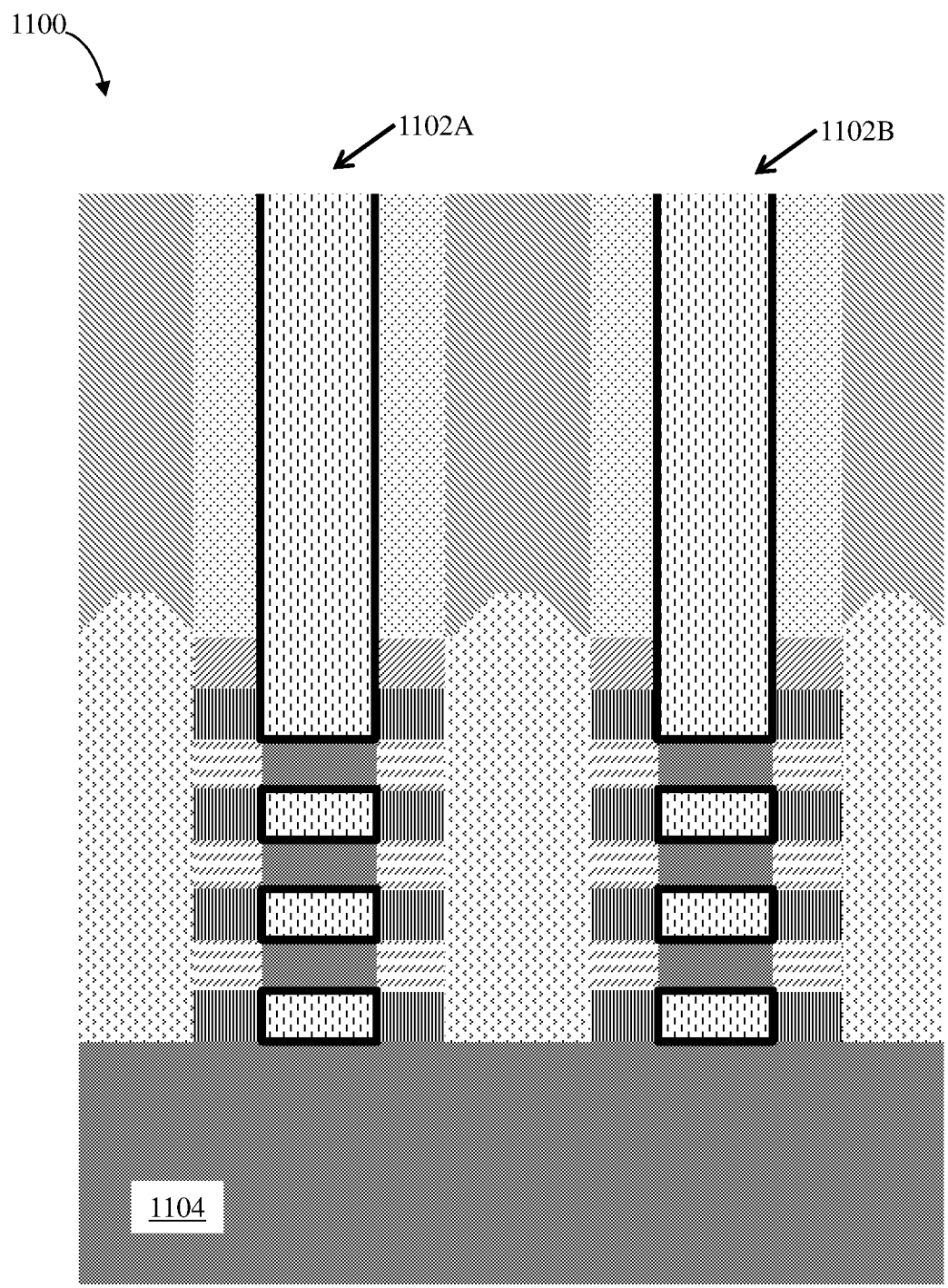
FIG. 11 depicts a cross-sectional view of a structure having a first nanosheet transistor and a second nanosheet transistor formed on a substrate during an intermediate operation of a method of fabricating a semiconductor device according to one or more embodiments of the present invention.

FIG. 11 illustrates a cross-sectional view of a structure 1100 having a first nanosheet transistor 1102A and a second nanosheet transistor 1102B formed on a substrate 1104 according to one or more embodiments of the present invention. For the sake of clarity, only two nanosheet transistors are illustrated. It is understood that any number of nanosheet transistors can be formed on the substrate 1104 according to one or more embodiments of the present invention.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
a nanosheet stack over a substrate, the nanosheet stack having a plurality of nanosheets, arranged such that each nanosheet does not directly contact an adjacent nanosheet;
an oxide recess region formed on a first end and a second end of a layer adjacent to each nanosheet;
a doped extension region on a first end and a second end of each nanosheet, wherein the doped extension region is defined by a displaced first material in the first and second end of each nanosheet from the oxide recess region, wherein the oxide recess region and the doped extension region directly contact a first epitaxy region and a second epitaxy region, wherein the first epitaxy region is formed on a first portion of the substrate and the second epitaxy region on a second portion of the substrate;
a dielectric layer on the nanosheet stack;
a gate formed on the nanosheet stack, wherein the gate comprises a metal gate having a first and a second gate sidewall and a high-k dielectric liner, wherein the oxide recess region formed in a layer adjacent to and on top of a topmost nanosheet of the plurality of nanosheets contacts the gate and one of the first epitaxy region or the second epitaxy region;
a first outer spacer disposed on the first gate sidewall of the metal gate;
a second outer spacer disposed on the second gate sidewall of the metal gate;
a first and a second epitaxy on one or more portions of the substrate; and
an interlayer dielectric (ILD) formed on the first epitaxy region, the second epitaxy region and the first and second outer spacers.

2. The semiconductor device of claim 1, wherein the first outer spacer and the second outer spacer are a silicon boron carbonitride (SiBCN) or a silicon oxide carbonitride (SiOCN).

3. The semiconductor device of claim 1, wherein each nanosheet of the plurality of nanosheets is silicon, the doped extension region is doped SiGe, and the oxide recess region is a silicon oxide (SiO).

4. The semiconductor device of claim 1, wherein each nanosheet has a thickness of about 2 nm to about 10 nm.

5. The semiconductor device of claim 1, wherein the doped extension region extends into the first and second end of each nanosheet about 3 nm to about 12 nm.

6. The semiconductor device of claim 1, wherein the doped extension region extends into the first and second end of each nanosheet about 5 nm to about 8 nm.

* * * * *